United States Patent [19]

Kuroda et al.

[11] Patent Number: 4,949,144
[45] Date of Patent: Aug. 14, 1990

[54] SEMICONDUCTOR PHOTO-DETECTOR HAVING A TWO-STEPPED IMPURITY PROFILE

[75] Inventors: Fumihiko Kuroda, Yokohama; Tetsuo Sadamasa, Chigasaki; Nobuo Suzuki, Tokyo; Masaru Nakamura, Kawaguchi, all of Japan

[73] Assignee: Kabushiki Kaisha Toshiba, Kawasaki, Japan

[21] Appl. No.: 240,345

[22] Filed: Sep. 1, 1988

Related U.S. Application Data

[63] Continuation of Ser. No. 903,426, Sep. 4, 1986, abandoned.

[30] Foreign Application Priority Data

Sep. 24, 1985 [JP] Japan .................. 60-208808
Sep. 24, 1985 [JP] Japan .................. 60-210419
Dec. 4, 1985 [JP] Japan .................. 60-271568

[51] Int. Cl.[5] .............. H01L 29/205; H01L 31/06
[52] U.S. Cl. .......................... 357/30; 357/13; 357/16; 357/52
[58] Field of Search ............ 357/30, 16, 13, 30, 357/52

[56] References Cited

U.S. PATENT DOCUMENTS

| 3,497,776 | 2/1970 | Philips ........................ | 357/90 |
| 4,153,904 | 5/1979 | Tasch et al. .................. | 357/90 |
| 4,258,375 | 3/1981 | Hsieh et al. .................. | 357/16 |
| 4,328,508 | 5/1982 | Kressel et al. ................ | 357/30 |
| 4,400,221 | 8/1983 | Rahilly ...................... | 357/61 |
| 4,651,187 | 3/1987 | Sugimoto et al. .............. | 357/16 |
| 4,656,494 | 4/1987 | Kobayashi et al. ............. | 357/13 |

FOREIGN PATENT DOCUMENTS

| 55-13957 | 1/1980 | Japan . | |
| 58-53867 | 3/1983 | Japan . | |
| 59-106165 | 6/1984 | Japan . | |
| 60-178673 | 9/1985 | Japan ................. | 357/13 |

OTHER PUBLICATIONS

Taguchi et al., "Planar Type InGaAs ... Communication", pp. 71–78.
2311 Fujitsu Scientific and Technical Journal, vol. 21, No. 1, Mar. 12, 1985, Kawasaki, Japan, pp. 19-30; T. Sakurai, "Optical Semiconductor Devices Operating in the 1 $\mu$m Wave-Length Region".
Journal of the Electrochemical Society, vol. 129, No. 1, Jan. 12, 1982, Detroit, USA, pp. 1320-1324, J. D. Oberstar et al., "SIMS Studies of Semi-insulating InP Amorphized by Mg and Si".
Patent Abstracts of Japan, vol. 8, 4 No. 226 (E-272) (1663) Oct. 17, 1984.
IEEE Transactions of Electron Devices, vol. ED-16, No. 11, Nov. 1969, New York, U.S. pp. 923-9271 H. Yonezu et al., "Computer-Aided Design of a Si Avalanche Photodiode".
8030 Electronics Letters, vol. 19, 1 No. 2, Jan. 1983, London, GB, pp. 61, 62; M. Ikeda et al., "Planar InP-/InGaAs-APD with a Guarding Formed by Cd Diffusion through $SiO_2$".
Journal of Electrochemical Society, vol. 129, No. 6, "SIMS Studies of Semi-Insulating InP Amorphized by Mg and Si", J. D. Oberstar and B. G. Streetman et al., Jun. 1982.
IEEE Transactions on Electron Devices, vol. ED-29, No. 9, "A Planar ImP/InGaAsP Heterostructure Avalanche Photodiode", T. Shirai et al., Sep. 1982.

Primary Examiner—Jerome Jackson, Jr.
Attorney, Agent, or Firm—Oblon, Spivak, McClelland, Maier & Neustadt

[57] ABSTRACT

A semiconductor photo-detector having a two-stepped impurity profile comprises a semiconductor substrate, a light absorption layer of a first conductivity type formed on a semiconductor substrate, a multiplication layer of a first conductivity type formed on the light absorption layer to multiply a photocurrent, a semiconductor region of a second conductivity type formed on the multiplication layer and constituting an abrupt pn junction with the multiplication layer, and a guard ring area of a second conductivity type formed around a periphery of the semiconductor region, whereby the carrier concentration profile of the guard ring region is sharp at its surface and flat below that surface.

5 Claims, 7 Drawing Sheets

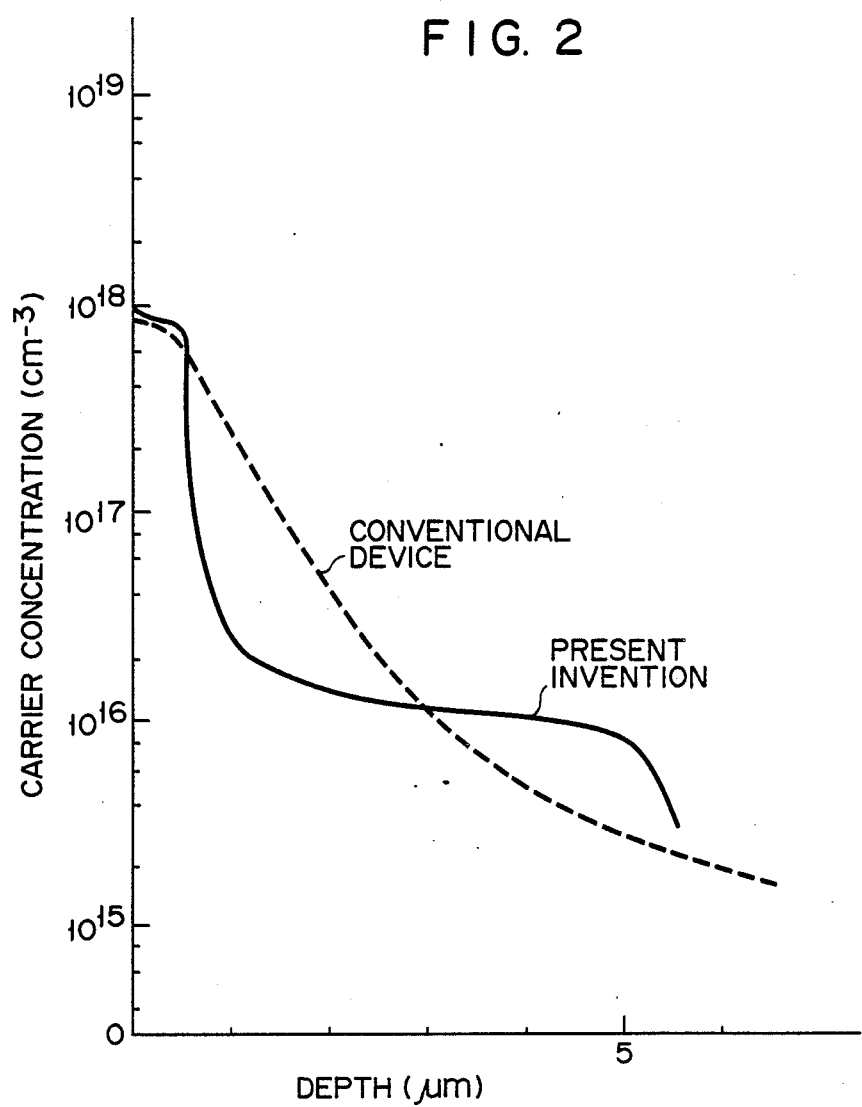

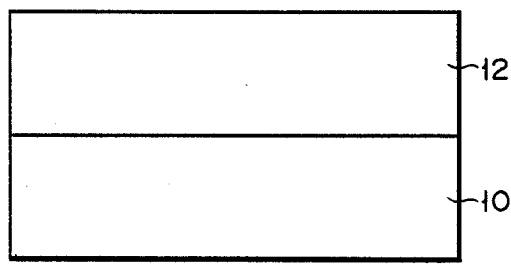
F I G. 3A
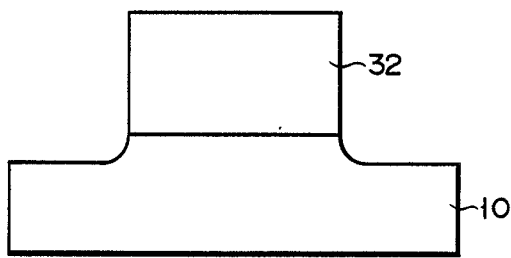
F I G. 3B
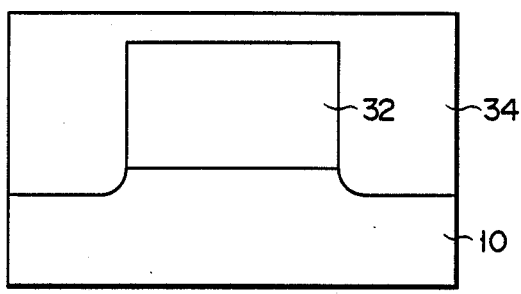
F I G. 3C
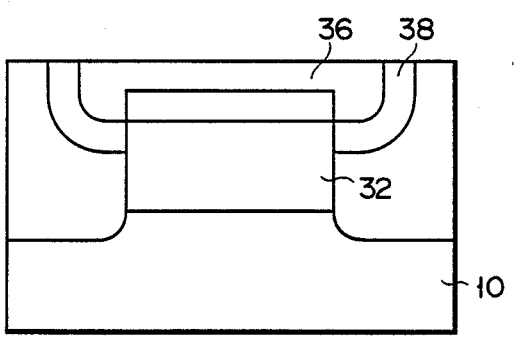
F I G. 3D

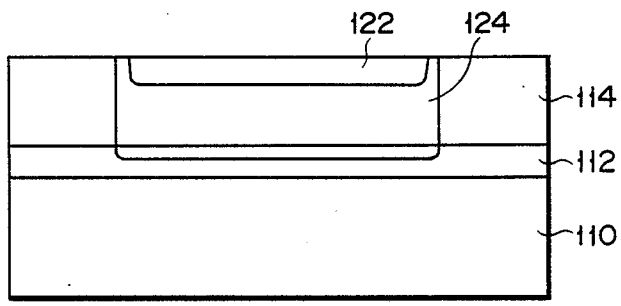
FIG. 6C
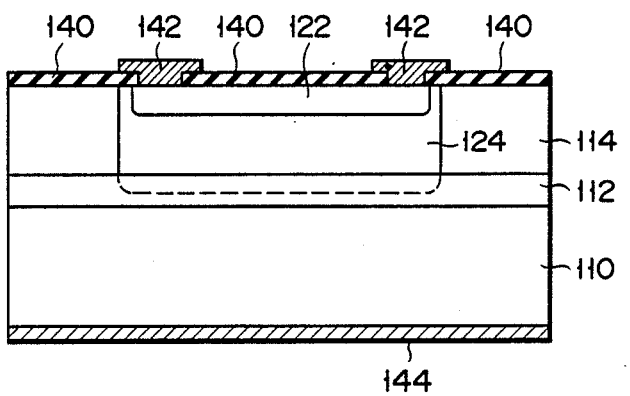
FIG. 6D
FIG. 7
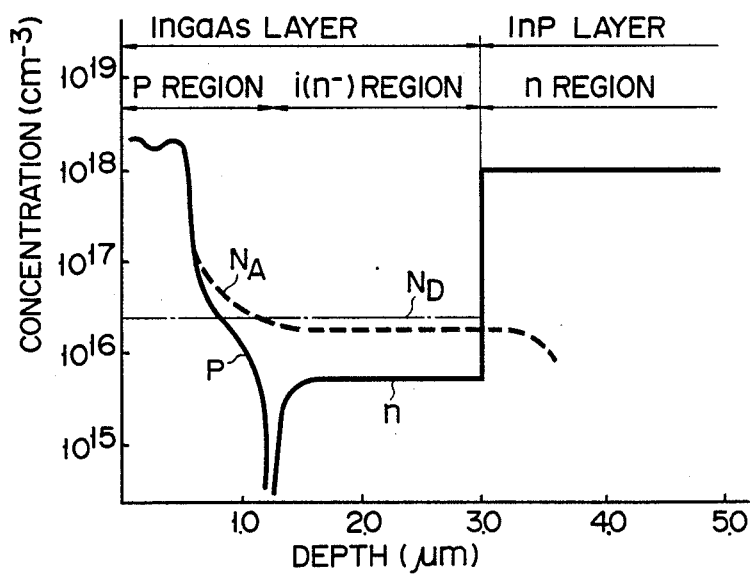

SEMICONDUCTOR PHOTO-DETECTOR HAVING A TWO-STEPPED IMPURITY PROFILE

This application is a continuation of application Ser. No. 903,426, filed on Sept. 4, 1986, now abandoned.

BACKGROUND OF THE INVENTION

This invention relates to a semiconductor photodetector for use, for example, in an opticsl communication system.

A p+in+ type photodiode and a a so-called avalanche photodiode (APD) for allowing a light-induced carrier to be multiplied through the application of a reverse bias to a pn junction are known as a semiconductor photo-device. In order to properly employ these photodiodes as a photo-detector it is required that the concentration gradient and concentration profile in a semiconductor layer be controlled in a proper fashion.

In a planar type APD, for example, a photo-detecting section is so formed as to provide an abrupt junction and guard ring section for preventing edge breakdown is so formed as to provide a graded junction. In this connection it is known that the lower the background carrier concentration level, the greater the curvature radius of a diffusion layer in a planar device and the lower the carrier concentration gradient, then the greater the breakdown voltage of the graded junction. This is disclosed in IEEE Transactions on Electronic Devices, vol. ED-16, No.11, P924.

The carrier concentration of a multiplication layer is normally of the order of 1 to $3 \times 10^{16}$/cm$^3$. When the concentration gradient of a diffusion layer is reduced below $2 \times 10^{20}$/cm$^4$, then a breakdown voltage becomes greater abruptly, and does not depend on the curvature radius of the diffusion layer and a fluctuation in the background concentration.

In the conventional InP type APD, however, in order to form an abrupt pn junction at the photo-detecting section, cadmium, for example, was diffused at high temperature for a brief period. In order to form a graded pn junction at the guard ring section, zinc or cadmium, for example, was diffused as a P type impurity into an n type InP multiplication layer at a lower temperature for a long time period or beryllium was ion implanted followed by a heat treatment. In these methods it has been difficult to adequately attain a greater breakdown voltage difference between the guard ring section and the photo-detecting section.

In FIG. 2, the broken line shows a carrier concentration profile of a device obtained when beryllium was ion implanted into an InP Substitute at an acceleration voltage of 150 KeV and dosage of $5 \times 10^{13}$/cm$^2$ and the resultant structure was annealed under a partial pressure of phosphorus within an ampoule. This carrier concentration profile is disclosed in "Extended Abstracts of the 45th Autumn Meeting (1984) of the Japan Society of Applied Physics," 13a-K-6 (P. 568). In the semiconductor photo-detector fabricated by this method, the carrier concentration gradient is reduced to as small as 0.6 decade/μm in semilogrithmic scale, where it is understood that by "decade" is meant the exponent to the base 10 of the carrier concentration in atom/cm$^3$. In the neighborhood of $1 \times 10^{16}$/cm$^3$ in background carrier concentration the concentration gradient became around $1 \times 10^{20}$/cm$^4$, but with a gradual approximation to a surface the concentration was increased exponentially with the result that the breakdown voltage of the guard ring layer in the device was not adequate.

In a P+in+type photodiode, in order to obtain a high-speed response characteristic with a depletion layer adequately extended, the carrier concentration of the i region (intrinsic region) is selected to be below $1 \times 10^{16}$ cm$^{-3}$, normally at a temperature of 20° C. (this temperature is referred as such unless otherwise indicated to the contrary). In order to form an epilayer of high purity whose Carrier concentration level is below $1 \times 10^{16}$ cm$^{-3}$, a baking step of a growth reactor is necessary over a longer time period for both the vapor phase growth and the liquid phase growth. Furthermore, the selection of high purity material or the purification of the material is necessary for the intended purpose. This is one cause for a rise in production costs. Within the growth reactor used in the epitaxial growth of P+ and n+ high concentration layers there exists a residual impurity. It is therefore difficult to properly control the growth of an i layer and thus to perform a continuous growth of a high purity layer and high concentration layer within the same reactor. This constitutes an obstacle to a complex photosemiconductor device, such as an opto-electronic integrated circuit (OEIC). Thus, the epitaxial growth of a high-purity layer of below $1 \times 10^{16}$ cm$^{-3}$ in carrier concentration in a P+in+ type photodiode poses a problem in relation to the productivity, cost, and manufacturing flexibility.

SUMMARY OF THE INVENTION

An object of this invention is to provide a semiconductor photo-detector having a proper impurity concentration profile and concentration gradient.

Another object of this invention is to provide a semiconductor photo-detector having a guard ring layer which can provide a greater breakdown voltage difference in relation to a photo-detecting section and can be formed by a simpler manufacturing step with a better reproduction.

Another object of this invention is to provide a pin type photodiode which has a proper impurity concentration profile and is excellent in mass production and low in cost.

Another object of this invention is to provide a method for manufacturing a semiconductor photo-detector having a proper impurity concentration profile and concentration gradient.

In order to attain the aforementioned object a semiconductor photo-detector is provided which comprises: (1) a semiconductor substrate: (2) a light absorption layer of a first conductivity type formed on the semiconductor substrate; (3) a multiplication layer of the first conductivity type formed on the light absorption layer to multiply a photocurrent; (4) a semiconductor region of a second conductivity type formed on the multiplication layer and constituting an abrupt pn junction with said multiplication layer; and (5) a guard ring of the second conductivity type formed around the semiconductor region, in which the carrier profile of the guard ring is sharp at its surface and flat below that surface.

According to this invention an APD can be implemented which has a heretofore-unattainable high breakdown voltage difference between the photo-detecting section and the guard ring section. In an APD having an n type InP layer as the multiplication layer a pn junction of the photo-detecting section is formed as an abrupt junction through the thermal diffusion of cadmium. The guard ring layer is formed through the implantation of a magnesium ion so that its carrier concentration gradient is flat on the order of below 0.2 decade/$\mu$m in semi-logarithmic representation, where decade is as above defined, in which case the pn junction of the guard ring layer is located at that flat area. It is thus possible to obtain an APD having a breakdown voltage difference of over 100V between the photo-detecting section and the guard ring section.

According to this invention, a carrier concentration profile is obtained by implanting a magnesium ion under some condition into an n type InP layer of Group III–V compound semiconductors and performing a heat treatment. In this case, a preferable carrier concentration gradient is such that it is sharp at its surface on the order of over 3 decade/$\mu$m and flat below that surface on the order of below 0.2 decade/$\mu$m.

In order to attain the aforementioned object another semiconductor photo-detector is provided which comprises:

(1) a first kind of compound semiconductor having a first conductivity type;

(2) a second kind of compound semiconductor formed on the first kind of compound semiconductor and having the first conductivity type;

(3) a semiconductor region of a second conductivity type formed in proximity to the surface of the second kind of compound semiconductor; and (4) a high resistance region formed under the semiconductor region of the second conductivity type in a thickness direction of over 0.8 $\mu$m, functioning as a light absorption region and having a carrier concentration of below $1 \times 10^{16}$ cm$^{-3}$, whereby the high resistance region and semiconductor region are simultaneously formed through the ion implantation of an impurity of the second conductivity type and subsequent heat treatment and the carrier concentration of the high resistance region is below 50% of the background concentration of an area in which the high resistance region is formed.

It is known that a two-stepped concentration profile can be obtained through the implantation of a given kind of impurity ion into Group III–V compound semiconductors and subsequent heat treatment under a proper condition.

This outcome is disclosed by J. D. Oberstar et al. in "SIMS Studies of Semi-Insulating InP Amorphized by Mg and Si", J. Electrochem. Soc.: Solid-State Science and Technology, vol. 129, No. 6, PP. 1320 to 1325, June 1982. In this case a concentration level is flat, on the order of about 1 $\mu$m, noting that this flat layer is formed between two steps in the concentration profile. The impurity ion thus implanted is not always 100% activated after a heat treatment. However, the inventors found from the capacitance-voltage measurement and Hall effect measurement that magnesium in the flat concentration portion is almost activated to provide an acceptor. They also found that the flat concentration portion is continuing over 1 $\mu$m in depth. Making the acceptor concentration $N_A$ in the magnesium concentration flat portion substantially equal to the background concentration $N_D$ prior to the Mg ion implantation, a net carrier concentration at that area becomes a lower value |NA-ND| due to the compensation. If the magnesium concentration is not completely flat, some of the area becomes a n$^-$ region and the other area become a p$^-$ region.

According to this invention the aforementioned effect can be applied to a compound semiconductor photodetector having a pin type carrier concentration profile. An impurity ion of the second conductivity type is implanted into a compound semiconductor substrate or epitaxial layer of the first conductivity type, followed by the heat treatment of the resultant structure for diffusion and activation. Due to this treatment a region of the second conductivity type is formed in proximity to the surface of the structure with a flat concentration portion further deeply defined at a thickness of over 0.8 $\mu$m. The impurity concentration $N_A$ or $N_D$ activated at an area of at least 0.8 $\mu$m in that flat portion becomes equal to the background impurity concentration $N_D$ or $N_A$ within an allowable range of $\pm 50\%$. Thus, a pin type semiconductor photo-detector is fabricated with i region whose net carrier concentration is diminished down to below 50% of the background carrier concentration prior to the implantation of the impurity ion and down to below $1 \times 10^{16}$ cm$^{-3}$.

The photo-detector of this invention obviates the need of forming an epilayer of high purity and thus the need of performing a baking step of an epitaxial growth reactor at high temperature for a longer period of time which would otherwise have been required in the conventional counterpart. This device assures a greater improvement over the counterpart with respect to the productivity. Since this feature can save a specific choice and purification of materials, it is possible to improve the productivity of photo-devices and thus obtain a low-cost device. According to this invention it is possible to obtain a composite integrated device in which pin photodiode is combined with the other device having a P$^+$ and n$^+$ growth layer, such as semiconductor lasers, light emitting diodes or heterojunction bipolar transistors. This is because the difficulty of the continuous growth of i layer and P$^+$ or n$^+$ layer is removed.

A method for the manufacture of a semiconductor photo-detector is provided which comprises the steps of:

(1) selectively forming a semiconductor region of a second conductivity type on the surface of a semiconductor substrate having a light absorption layer of a first conductivity type and a multiplication layer of the first conductivity type overlying said light absorption layer:

(2) ion implanting an impurity of the second conductivity type around the periphery of the semiconductor region; and (3) heat treating the ion-implanted layer at a temperature of 650° to 750° C. to form a guard ring layer through an induced activation, (4) whereby the carrier concentration of the guard ring layer is sharp at the surface and flat below that surface.

According to the method of this invention a guard ring layer of an adequately high breakdown voltage can be obtained through a single ion implantation step and subsequent heat treatment step. The breakdown voltage of the guard ring layer depends on neither its curvature radius nor the background concentration level owing to a lower concentration gradient. Thus this invention assures a high yield during the manufacture of photodevices.

Another method for the manufacture of a semiconductor photo-detector according to this invention is provided which comprises the steps of:

(1) forming a first semiconductor layer of a first conductivity type on the surface of a semiconductor substrate of the first conductivity type, the first semiconductor layer being $1 \times 10^{16}$ to $1 \times 10^{17}$ atom/cm$^3$ in impurity concentration;

(2) forming a second semiconductor layer of the first conductivity type around the periphery of the first semiconductor layer, the second semiconductor layer being $1 \times 10^{15}$ to $1 \times 10^{16}$ atom/cm$^3$ in impurity concentration;

(3) implanting a magnesium ion into the first and second semiconductor layers to form an ion-implanted layer: and (4) activating the ion-implanted layer at a temperature of 650° to 750° C. to form a pn junction.

BRIEF DESCRIPTION OF THE DRAWINGS

Other objects and advantages of this invention will be apparent from the following description taken in conjunction with the accompanying drawings in which:

FIG. 2 is a graph showing the carrier profile of a guard ring portion of a semiconductor photo-detector of this invention and that of the prior art;

FIGS. 3A to 3E are views showing the steps of manufacturing a semiconductor photo-detector according to a second embodiment of this invention;

FIGS. 6A to 6D are views showing the steps of manufacturing a semiconductor photo-detector according to a fourth embodiment of this invention: and FIG. 7 is a view showing the carrier profile of a semiconductor photo-detector according to the fourth embodiment of this invention.

DETAILED DESCRIPTION OF THE PREFERRED EMBODIMENTS

Figure 1:
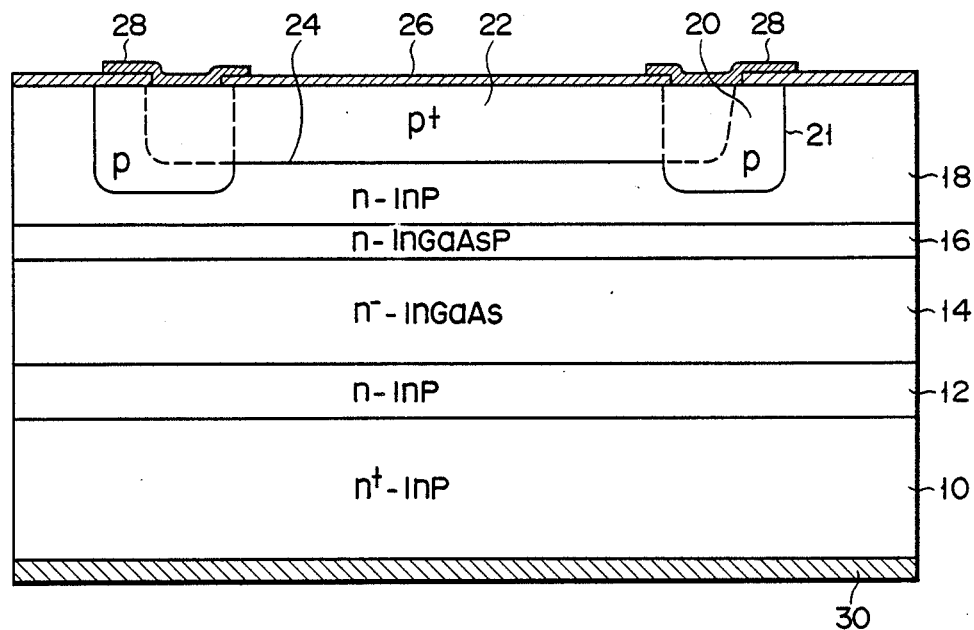
FIG. 1 is a cross-sectional view showing a semiconductor photo-detector according to a first embodiment of this invention.

FIG. 1 shows an InGaAs/InP-structured avalanche photodiode (APD) according to a first embodiment of this invention. The steps of manufacturing such an avalanche photo-diode will be explained below.

n Type InP buffer layer 12, n⁻type InGaAs or InGaAsP optical absorption layer 14, n type InGaAsP buffer layer 16 and n type InP multiplication layer 18 are sequentially epitaxially grown on n⁺type InP substrate 10 in that order. InP multiplication layer 18 is 5 μm in thickness and $1 \times 10^{16}$/cm$^3$ in carrier concentration. With an insulation film such as SiO$_2$, metal film such as Au or the like used as masks, magnesium is ion implanted into such a wafer at an acceleration voltage of 200 KeV and dosage of $1 \times 10^{14}$/cm$^2$. Then the mask is removed and over 3000Å-thick PSG film is deposited by a CVD (Chemical Vapor Deposition) on the resultant structure. Then that structure is heat treated for 20 minutes at 750° C. to form P type guard ring layer 20. pn-Junction 21 of guard ring layer 20 is about 4 μm in thickness deep from the surface of the structure. Then Cd is diffused by an ordinary method into the resultant structure to form P⁺ type InP layer 22 about 3 μm with p⁺junction 24 defined relative to multiplication layer 18. Thereafter, passivation film 26 is formed which serves also as an antireflection film. The passivation film is pierced to provide an opening over which P type electrode 28 is formed. n Type electrode 30 is formed on the reverse surface of the wafer to complete an InGaAs /InP-structured APD.

FIG. 2 shows a carrier concentration profile (see solid line) of the guard ring layer in the APD of this embodiment in which case the concentration profile is very sharp at its surface and substantially flat below that surface. The carrier concentration profile is a two-stepped curve, noting that in FIG. 2 the concentration gradient at the sharp portion is over 3 decade/μm in semilogrithymic scale and the flat portion is below 0.2 decade/μm in the same scale.

At this time a graded pn junction is formed at the flat portion of the carrier concentration profile. Let it be assumed that this pn junction is of a linear graded type. Since that background carrier concentration is $1 \times 10^{16}$/cm$^3$, the concentration gradient is below $1.5 \times 10^{20}$/cm$^4$. In this embodiment a greater breakdown voltage difference exists between the guard ring section and the photo-detecting section and thus the breakdown voltage does not depend upon the curvature radius of the guard ring pn junction and fluctuation in the background carrier concentration. In actual practice, a diode is manufactured by implanting a magnesium ion, under the aforementioned condition, into the n type InP substrate of $1 \times 10^{16}$/cm$^3$ in carrier concentration in which case it has a breakdown voltage of over 250 V. On the other hand, the pn junction formed through the thermal diffusion of Cd has a breakdown voltage of about 130 V. Thus, the guard ring of the APD of this invention has a breakdown voltage of more than 100 V greater than that obtained in the light receiving section.

First, the appearance of that high breakdown voltage at the guard ring layer is due to the fact that the guard ring layer has a low concentration gradient region at the depth of over 3 μm. In the second place, the high concentration region is formed at the surface of the guard ring layer and thus serves to permit a depletion layer which extends due to the application of a reverse bias to be absorbed at the surface portion, with the result that the sweep-out effect is suppressed at the surface portion. By the way, the main purpose is to form a pn junction at the flat portion of the carrier concentration profile and this structure may be made free from the high concentration region.

The curvature radius of the guard ring pn junction and background carrier concentration can be determined by properly selecting the acceleration voltage and dosage of the ion implantation as well as the temperature and time of a heat treatment. In this embodiment the guard ring layer is formed through the implantation of a magnesium ion into the n type InP layer. However this invention is not restricted to this embodiment. For example, the guard ring layer may be formed with the use of Zn or Cd. As a semiconductor material use may also be made of a compound semiconductor other than InGaAs/InP.

A semiconductor photo-detector according to a second embodiment of this invention will be explained below with reference to FIGS. 3A to 3E and 4.

Figure 3E:
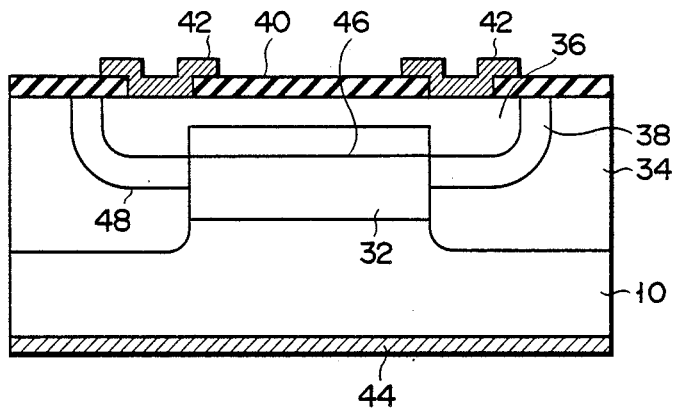
Figure 4:
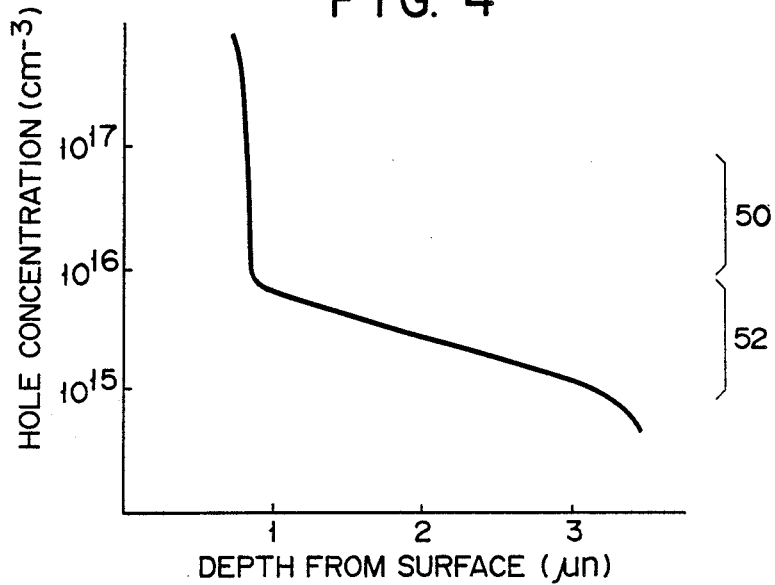
FIG. 4 is a view showing a carrier profile of a guard ring portion of the second embodiment of this invention.

FIGS. 3A to 3E are cross-sections showing the steps of manufacturing a photo-detector and FIG. 4 is a graph showing a hole concentration profile when a magnesium ion is implanted into an InP crystal.

As shown in FIG. 3A, n type InP layer 12 of, for example, $2\times10^{16}$ cm$^{-3}$ in electron density is formed by a liquid phase growth method on a major surface of n type InP substrate 10. Then with a photoresist as a mask, InP layer 12 and portion of InP substrate 10 are selectively etched as shown in FIG. 3B to provide a circular area 32 as a photo-detecting section. Then, n type InP layer 34 is formed by a liquid growth method to cover the resultant structure. The electron density of n type InP layer 34 is controlled as to obtain, for example, $6\times10^{15}$ cm$^{-3}$. As another means for forming InP layer 34, an InP layer may be selectively grown on the etched-away area and InP layer may be again grown to planarize the main surface.

Then an SiO$_2$ and photoresist are selectively formed on the main surface of the InP layer and with these as masks magnesium ions are implanted into the resultant structure. This ion implantation was performed at, for example, an acceleration voltage of 150 KeV and dosage of $5\times10^{13}$ cm$^{-2}$. After the removal of the SiO$_2$ and photoresist, a PSG layer is formed on the major surface of the resultant structure, followed by a heat treatment for 20 minutes at 750° C. for instance. As a result, P type InP layer 36 and low concentration InP layer 38 are formed simultaneously.

Then as shown in FIG. 3E, Si$_3$N$_4$ film 40 is formed on the major surface at an area where the PSG layer was formed. Electrodes 42 and 44 are formed by a vacuum deposition method to complete a semiconductor photo-detector.

The pn junction of the so constructed photo-detector has been found to be two types in spite of a single magnesium ion implantation step. Furthermore the photodetector so manufactured has been found to have an excellent characteristic, the reason of which will be explained below with reference to FIG. 4.

The hole concentration produced in the InP crystal is found to have two types: a sharp variation portion 50 and gradual variation portion 52. Where pn junction 46 of the photo-detecting section is formed through the utilization of the portion 50, an abrupt type pn junction is provided. Where, on the other hand, pn junction 48 of the guard ring section is formed through the utilization of area 52, a graded type pn junction varying in a very gradual carrier concentration profile is formed or a pn junction is formed with a low concentration layer formed therebetween. The abrupt type pn junction 46 of the photo-detecting section is formed by P type InP layer 36 and n type InP layer 32 at a carrier concentration level of over $1\times10^{16}$ cm$^{-3}$ but less than $1\times10^{17}$ cm$^{-3}$ where no adverse effect is exerted over the noise characteristic. The guard ring area is formed in InP layer 34 of $1\times10^{15}$ to $1\times10^{16}$ cm$^{-3}$ in carrier concentration. Though not shown in the above FIG., the pn junction of the photo-detecting section and guard ring area has been confirmed, through the evaluation of an EBIC (Electron Beem Induced Current) characteristic, voltage/capacity variation characteristic and breakdown voltage characteristic, to be of an abrupt type or a type with a low concentration layer formed therebetween.

The breakdown voltage difference between two such type of pn junctions was about 40V in which case the uniform breakdown of the photo-detecting section first occurred. At the pn junction of the guard ring area no local breakdown due to the concentration of an applied electric field occurred, in spite of the curvature radius of the guard ring area, thus obtaining a stable device characteristic.

A semiconductor photo-detector according to a third embodiment of this invention will be explained below with reference to FIGS. 5A to 5E.

Figure 5A:
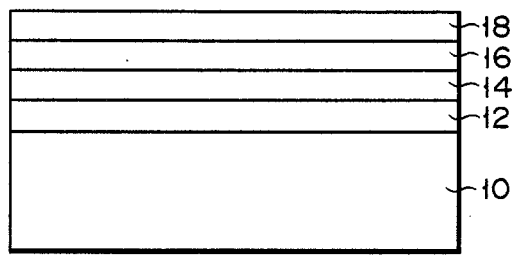
FIGS. 5A to 5E are views showing the steps of manufacturing a semiconductor photo-detector according to a third embodiment of this invention.
Figure 5B:
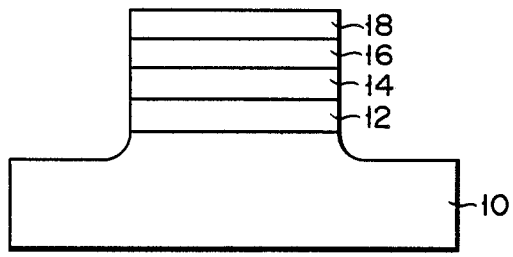
Figure 5C:
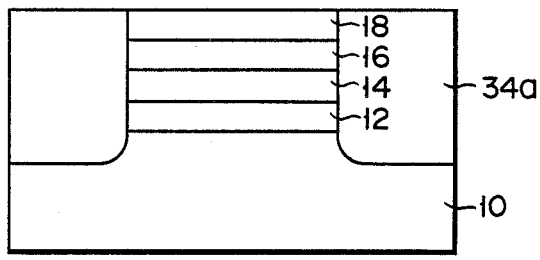
Figure 5D:
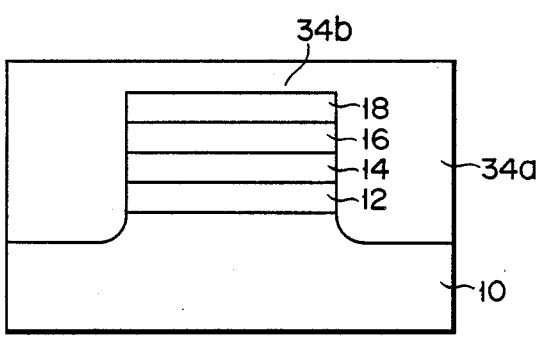

In FIG. 5A, n type InP layer 12, n type InGaAs light absorption layer 14, n type InGaAsP layer 16 and n type InP multiplication layer 18 are sequentially formed by a liquid phase growth method on n type InP substrate 10, noting that each crystalline layer is so grown as to have a substantially equal lattice constant. Then, as shown in FIG. 5B, with an Si$_3$N$_4$ film as a mask the substrate is mesa-etched so that a circular photo-detecting section may be formed. As shown in FIG. 5C, n type InP layer 34a is first crystal-grown in a selective fashion to bury an area formed at the mesa-etching step. After the removal of the Si$_3$N$_4$ layer, n type 34b is additionally formed by a growth method on the main surface as shown in FIG. 5D. n type InP layer 18 and n type InP layer 34a, 34b, are so set as to have $5\times10^{16}$ cm$^{-3}$ and $9\times10^{15}$ cm$^{-3}$ in carrier concentration, respectively.

Figure 5E:
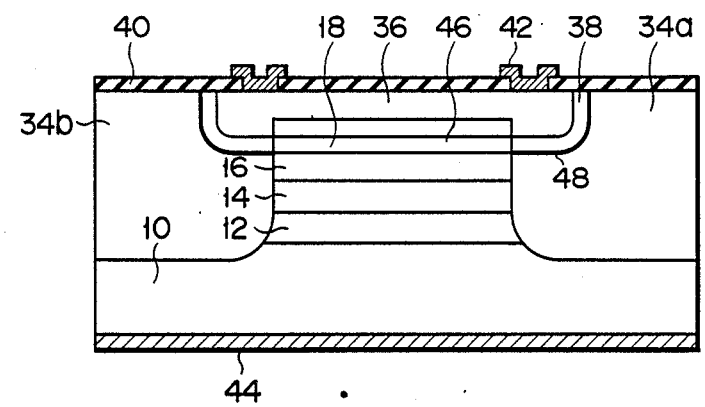

Then a magnesium ion is implanted into the major surface portion of the resultant structure, as in the case of the second embodiment, at an acceleration voltage of 200 KeV and dosage of $1\times10^{14}$ cm$^{-2}$. The surface of the structure is heat treated for 10 minutes at 700° C. under a partial pressure of phosphorus to form P type InP layer 36 as shown in FIG. 5E, as well as an abrupt type pn junction 46 and graded type junction 48 with the low concentration layer 38 therebetween. Finally insulative film 40 and electrodes 42 and 44 are formed on the surface of the resultant structure, completing a semiconductor photo-device.

The semiconductor photo-detector so constructed is of a relatively high concentration abrupt type, making it possible to obtain a high-speed light signal responsive device. Furthermore this is used as a photo-detector for optical communication which can be responsive to a light wavelength of 1.3 μm and 1.5 μm.

FIG. 4 is one form of a carrier concentration profile when a magnesium ion is implanted into the InP crystal. The concentration profile takes a variety of forms, depending upon the conditions of the magnesium ion implantation and subsequent heat treatment. The abrupt junction and graded type pn junctions can be obtained through the utilization of sharp and flat portions of the concentration profile, respectively A semiconductor photo-detector according to a fourth embodiment of this invention will be explained below with reference to FIGS. 6A to 6D and 7.

Figure 6A:
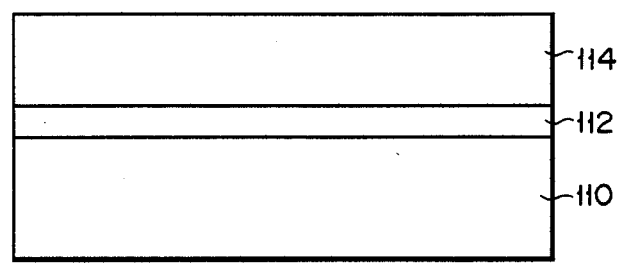

This semiconductor photo-detector is of a pin type. As shown in FIG. 6A, n+ InP buffer layer 112 of $1\times10^{18}$ cm$^{-3}$ in carrier concentration is formed on n+ type InP substrate 110 and n− In$_{0.53}$ Ga$_{0.47}$ As layer 114 of 3 μm in thickness and $2.5\times10^{16}$ cm$^{-3}$ in carrier concentration level is formed on n+ InP buffer layer 112, noting that these layers 112 and 114 are formed by a hydride vapor-phase epitaxial growth method. This extent of the carrier concentration level obviates the need of any extra consideration for growing the high purity layer in a growth reactor.

Figure 6B:
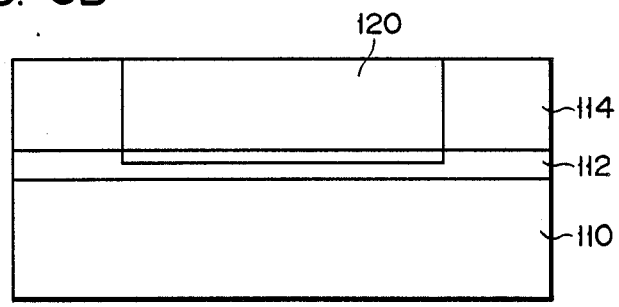

As shown in FIG. 6B a magnesium ion is selectively implanted into the resultant substrate through its surface at an acceleration voltage of about 240 KeV and dosage of about $2\times10^{14}$ cm$^{-12}$ to provide ion-implanted layer 120.

After a PSG protective layer is formed, an annealing step is carried out for 15 minutes at 750° C. with a FSG protective layer formed, at which time P+ region 122 of 1 to $2\times 10^{18}$ cm$^{-3}$ in concentration level is formed in and near the surface of the resultant structure as shown in FIG. 6C. In this case, however, the ion-implanted layer under P+ region 122 becomes a flat region (hereinafter, referred to it as a flat portion) 124 with the concentration level of the magnesium ion flattened. Since an acceptor concentration level at flat portion 124 is about $2.0\times 10^{16}$ cm$^{-3}$, the carrier concentration level of the flat portion 124 is reduced to $5.0\times 10^{15}$ cm$^{-3}$ in an n type due to its compensation in relation to the donor concentration level of $2.5\times 10^{16}$ cm$^{-3}$ at n+ InP buffer layer 112. By so doing it is possible to obtain a pin type structure whose carrier profile is shown in FIG. 7.

Film 140, serving as both a passivation film and anti-reflection film, is formed on the surface of the resultant structure to complete a pin type photodiode with P side electrode 142 formed on P+ region 122 and n side electrode 144 formed on the rear side of substrate 110 as shown in FIG. 6D.

According to the method and apparatus of this invention, since the carrier concentration level of the epitaxial growth layer is an ordinary value of the order of $2.5\times 10^{16}$ cm$^{-3}$ it can satisfactorily be attained under an ordinary service condition of the growth reactor. Thus no particular consideration need be given to the baking step at a high temperature for a longer period of time as well as to the purification step for the material. It is therefore possible to obtain a semiconductor photodetector with high quantity and at a lower cost.

What is claimed is:

1. A semiconductor photodetector comprising:
a semiconductor substrate;
a light absorption layer of a first conductivity type formed on the semiconductor or substrate;
a multiplication layer of said first conductivity type, formed on the light absorption layer, for multiplying a photocurrent;
a semiconductor region of a second conductivity type formed on the multiplication layer and constituting an abrupt pn junction with said multiplication layer; and
a guard ring area of a second conductivity type formed around a periphery of the semiconductor region such that a carrier concentration profile of said guard ring area has a large gradient portion at a location adjacent to a device surface and a small gradient portion below the large gradient portion, said small gradient portion having substantially constant carrier concentration and at least reaching to a pn junction between said guard ring area and an adjacent layer;
wherein the carrier concentration gradient of said large gradient portion is above 3 decade/$\mu$m, and the carrier concentration gradient of said small gradient portion is below 0.2 decade/$\mu$m, and the unit decade/$\mu$m is defined as the exponent to the base 10 of the carrier concentration in atom/cm$^3$ per $\mu$m of depth in said guard ring area.

2. A semiconductor photo-detector according to claim 1, wherein a buried layer is provided around said multiplication layer, an impurity concentration level of said multiplication layer is $1\times 10^{16}$ to $1\times 10^{17}$ atom/cm$^3$, said buried layer has an impurity concentration level of $1\times 10^{15}$ to $\times 10^{16}$ atom/cm$^3$, and an impurity of said second conductivity type comprises magnesium.

3. A semiconductor photo-detector according to claim 1, wherein a pn junction defined between said multiplication layer and said semiconductor region is an abrupt type and a pn junction formed in said guard ring area is a graded type.

4. A semiconductor photo-detector according to claim 1, wherein a pn junction defined between said multiplication layer and said semiconductor region is of an abrupt type and an inner portion of a side area of said guard ring area constitutes a low concentration layer.

5. A semiconductor photo-detector comprising:
a semiconductor substrate;
a light absorption layer of a first conductivity type formed on the semiconductor substrate;
a multiplication layer of said first conductivity type, formed on the light absorption layer, for multiplying a photocurrent;
a semiconductor region of a second conductivity type formed on the multiplication layer and constituting an abrupt pn junction with said multiplication layer; and
a guard ring area of a second conductivity type formed around a periphery of the semiconductor region such that a carrier concentration profile of said guard ring area has a large gradient portion at a location adjacent to a device surface and a small gradient portion below the large gradient portion, said small gradient portion having substantially constant carrier concentration, and at least reaching to a p-n junction between said guard ring area and an adjacent layer;
wherein said multiplication layer is InP and said guard ring area is formed by a magnesium ion implantation; and
wherein the carrier concentration gradient of said large gradient portion is above 3 decade/$\mu$m, and the carrier concentration gradient of said small gradient portion is below 0.2 decade/$\mu$m, and the unit decade/$\mu$m is defined as the exponent to the base 10 of the carrier concentration in atom/cm$^3$ per $\mu$m of depth in said guard ring area.

* * * * *